(12) United States Patent
Fusayasu et al.

(10) Patent No.: US 7,409,665 B2
(45) Date of Patent: Aug. 5, 2008

(54) METHOD FOR CHECKING RETURN PATH OF PRINTED AND CAD APPARATUS FOR DESIGNING PATTERNS OF PRINTED BOARD

(75) Inventors: Hirotsugu Fusayasu, Uji (JP); Seiji Hamada, Osaka (JP); Shoichi Mimura, Hirakata (JP); Miyoko Irikiin, Amagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 295 days.

(21) Appl. No.: 10/555,762

(22) PCT Filed: Feb. 3, 2005

(86) PCT No.: PCT/JP2005/001593

§ 371 (c)(1),
(2), (4) Date: Nov. 7, 2005

(87) PCT Pub. No.: WO2005/076164

PCT Pub. Date: Aug. 18, 2005

(65) Prior Publication Data

US 2007/0044062 A1  Feb. 22, 2007

(30) Foreign Application Priority Data

Feb. 5, 2004  (JP) ............... 2004-029049

(51) Int. Cl.
G06F 17/50  (2006.01)

(52) U.S. Cl. ........................... 716/15; 716/4

(58) Field of Classification Search ............ None
See application file for complete search history.

(56) References Cited

U.S. PATENT DOCUMENTS 5,729,183 A  3/1998  Schuchmann et al.
6,236,572 B1  5/2001  Teshome et al.

(Continued)

FOREIGN PATENT DOCUMENTS

JP  2001-331539  11/2001

(Continued)

OTHER PUBLICATIONS

European Search Report, Application No. EP 05 70 9686, Mar. 2006, 2 pages.

*Primary Examiner*—Leigh Marie Garbowski
(74) *Attorney, Agent, or Firm*—Wenderoth, Lind & Ponack, L.L.P.

(57) ABSTRACT

A CAD apparatus designing patterns of a printed board. The apparatus includes a signal wiring pattern detecting unit for detecting a signal wiring pattern, and a guard ground detecting unit for tracing the signal wiring pattern along the longitudinal direction thereof, in order to detect whether or not a guard ground exists within a distance from the signal wiring pattern to a predetermined first discriminant value, identify a non-guard ground section within the distance to the first discriminant value, and to detect whether or not a guard ground exists within another distance from the signal wiring pattern to a second discriminant value, which is larger than the first discriminant value. The apparatus also includes a return path judging unit for judging an error of guard ground when no guard ground exists within the distance to the second discriminant value, thereby quickly checking a return path without mistake.

7 Claims, 8 Drawing Sheets

U.S. PATENT DOCUMENTS

| | | | |
|---|---|---|---|
| 6,381,730 B1 * | 4/2002 | Chang et al. | 716/5 |
| 6,553,555 B1 | 4/2003 | Green et al. | |
| 6,643,831 B2 * | 11/2003 | Chang et al. | 716/4 |
| 6,769,102 B2 * | 7/2004 | Frank et al. | 716/5 |
| 6,859,915 B1 * | 2/2005 | Frank et al. | 716/5 |
| 6,971,077 B1 * | 11/2005 | Frank et al. | 716/5 |

FOREIGN PATENT DOCUMENTS

| | | |
|---|---|---|
| JP | 2002-16337 | 1/2002 |

* cited by examiner 3 5 GUARD GROUND NG SECTION

GUARD GROUND DISCRIMINANT GL
3 4 GUARD GROUND OK SECTION
3 2 GUARD GROUND
3 1 SIGNAL WIRING PATTERN 3 5 a GUARD GROUND NG SECTION A
3 5 b GUARD GROUND NG SECTION B
3 6 a GUARD GROUND TERMINAL X
3 6 b GUARD GROUND TERMINAL Y

GUARD GROUND DISCRIMINANT GU
3 4 GUARD GROUND OK SECTION
3 2 GUARD GROUND
3 1 SIGNAL WIRING PATTERN

IN CASE OF SMALLER GUARD GROUND DISCRIMINANT

IN CASE OF LARGER GUARD GROUND DISCRIMINANT

METHOD FOR CHECKING RETURN PATH OF PRINTED AND CAD APPARATUS FOR DESIGNING PATTERNS OF PRINTED BOARD

BACKGROUND OF THE INVENTION

1. Field of the Invention

The present invention relates to wiring design of a printed board, more specifically, to a method for checking a return path of a printed board and a CAD (computer aided design) apparatus for designing patterns of a printed board, which can take an EMC (electromagnetic compatibility) countermeasure for preventing the generation of unwanted emission noise from a printed board.

2. Background of the Related Art

In order to reduce unwanted emission noise from electronics, such as digital audio-visual equipment or information equipment, it is important to figure out a wiring path in a circuit board which may constitute a noise source. In a conventional CAD for a printed board, when detecting a wiring error, a person visually checks whether a wiring path of clock wiring pattern violates an EMC design condition in order to correct the violated point of the wiring path.

However, in the above-mentioned CAD for a printed board, since detection of an error in EMC design is dependent upon a person, there is a problem that leakage of detection is likely to occur and it takes much time to detect a error.

For this countermeasure, since recognition technology of pattern shapes is developed in CAD for a printed board, it is possible to detect a guard ground, that is a guard pattern with ground attribution, existing adjacent to a signal wiring. For a typical detection method, if there is a wiring section in which a guard ground does not exist within a defined guard ground discriminant value with respect to a signal wiring, an error is thought to occur.

JP-2002-16337-A is related art in this field of invention.

However, in the above-mentioned method for detecting a guard ground, as shown in FIG. 8, in a case of using a small defined guard ground discriminant value G, a splay portion 43 of a guard ground, around which a pad or a via hole is located for a signal wiring pattern 31, will be judged as an error of discontinuity of the guard ground.

In another case of using a large defined guard ground discriminant value G, on the other hand, a short erroneous discontinued portion 44 of the guard ground will be judged to be satisfactory.

To solve the above problem, it is an object of the present invention to provide a method for checking a return path of a printed board and a CAD apparatus for designing patterns of a printed board, which can check a return path without mistake more quickly than the conventional method.

BRIEF DESCRIPTION OF THE INVENTION

To attain the above object, a method for checking a return path of a printed board, according to the present invention, includes steps of:

detecting a signal wiring pattern with reference to wiring information of the printed board;

tracing the signal wiring pattern along the longitudinal direction thereof, to detect whether or not a guard ground exists within a distance from the signal wiring pattern to a predetermined first discriminant value GL;

identifying a non-guard ground section in which no guard ground exists within the distance to the first discriminant value GL;

setting up a second discriminant value GU larger than the first discriminant value GL;

detecting whether or not a guard ground exists within another distance from the signal wiring pattern to the second discriminant value GU in the non-guard ground section; and judging an error of guard ground when no guard ground exists within the distance to the second discriminant value GU in the non-guard ground section.

It is preferable in the checking method according to the present invention to include a step of judging an error of guard ground when a discontinued guard ground exists within the distance to the second discriminant value GU in the non-guard ground section.

It is preferable in the checking method according to the present invention to include a step of judging an error of guard ground when satisfying a relation: $L \leqq 2(GU^2-G^2)^{1/2}$ wherein L is a length of the non-guard ground section, and G is a distance from the signal wiring pattern on the border of the non-guard ground section to the guard ground.

It is preferable in the checking method according to the present invention that the printed board is a multilayer printed board including a wiring layer in which the signal wiring pattern resides, and a ground layer in which a ground plane resides, and the method further includes a step of judging an error of guard ground when no guard ground exists within the distance to the second discriminant value GU in the non-guard ground section and no ground, which is connected to the guard ground, exists in the ground layer.

It is preferable in the checking method according to the present invention that the first discriminant value GL is defined as a shortest distance between lines during pattern design of the printed board.

The above-mentioned checking method can be realized as a program executable on a computer, and the program can be recorded in a recording media.

Moreover, a CAD apparatus for designing patterns of a printed board, according to the present invention, includes:

a signal wiring pattern detecting unit for detecting a signal wiring pattern with reference to wiring information of the printed board;

a guard ground detecting unit for tracing the signal wiring pattern along the longitudinal direction thereof, to detect whether or not a guard ground exists within a distance from the signal wiring pattern to a predetermined first discriminant value GL, and for identifying a non-guard ground section in which no guard ground exists within the distance to the first discriminant value GL, and for detecting whether or not a guard ground exists within another distance from the signal wiring pattern to a second discriminant value GU, which is larger than the first discriminant value GL, in the non-guard ground section; and a return path judging unit for judging an error of guard ground when no guard ground exists within the distance to the second discriminant value GU in the non-guard ground section.

According to this approach, it is possible to check quickly both a splay portion and a short discontinued portion of the guard ground without mistake. Consequently, an EMC countermeasure for suppressing an electromagnetic wave generated from a high frequency current loop, which is configured of the signal wiring and the guard ground, can be effectively adopted.

DETAILED DESCRIPTION OF THE INVENTION

Embodiment 1

Figure 1:
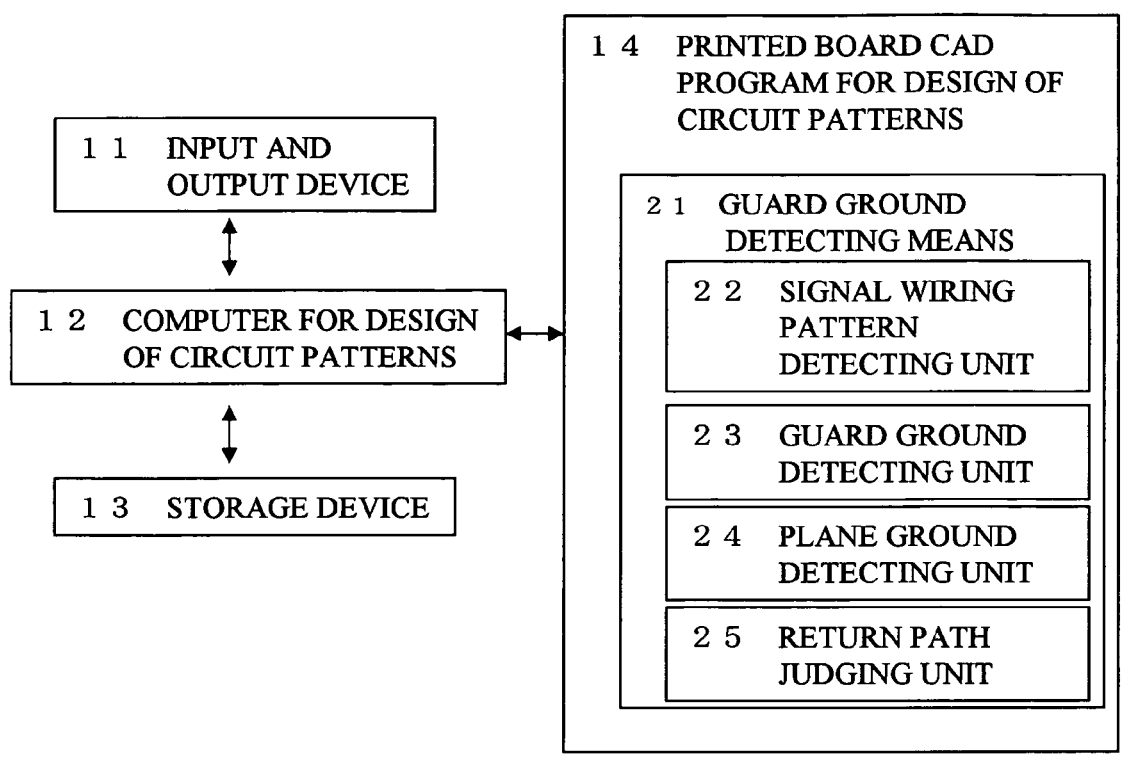
FIG. 1 is a block diagram showing an example of a CAD apparatus for EMC design according to the present invention.
Figure 2:
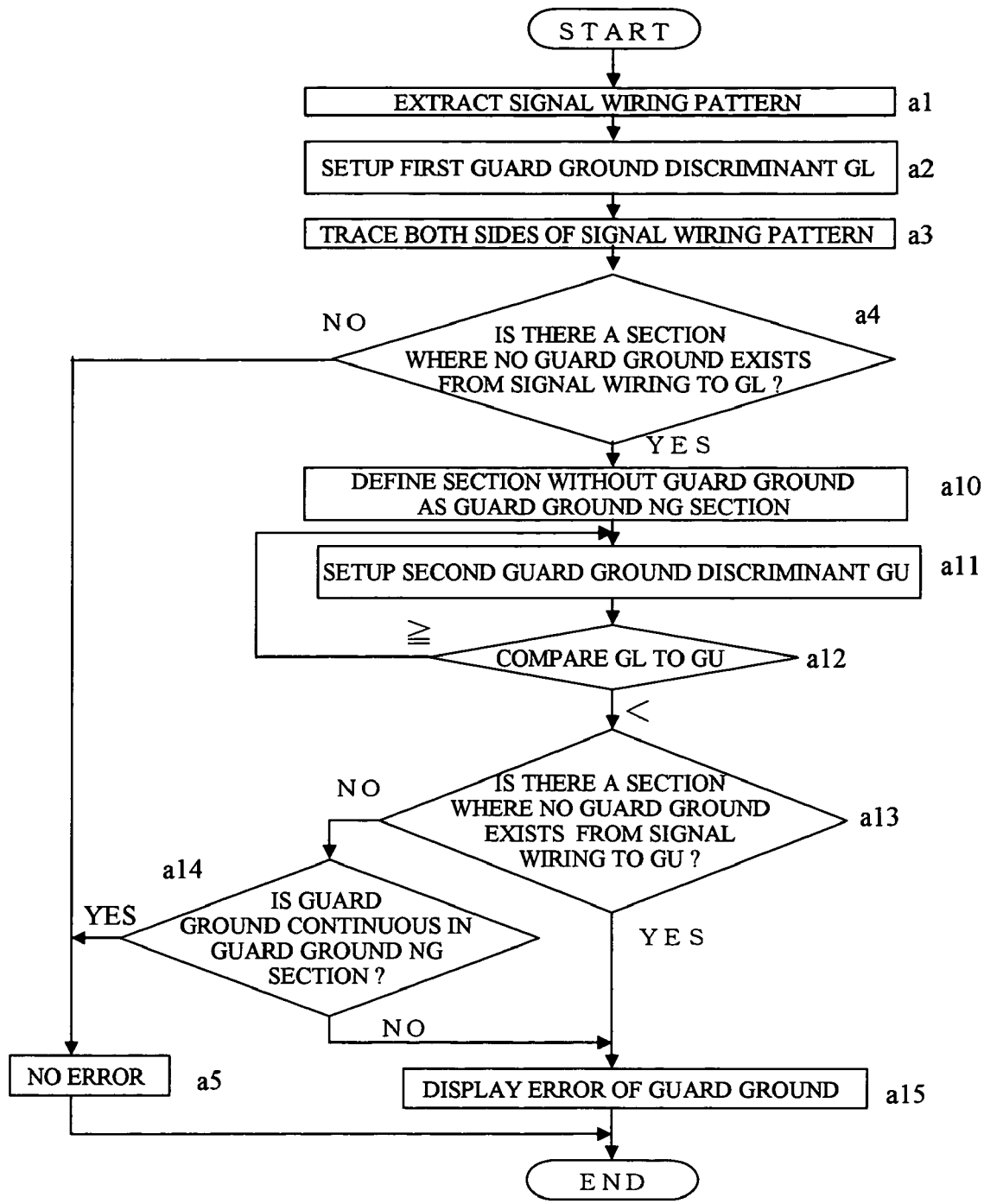
FIG. 2 is a flowchart showing an example of a method for checking a return path of a printed board, according to the present invention.
Figure 3A:
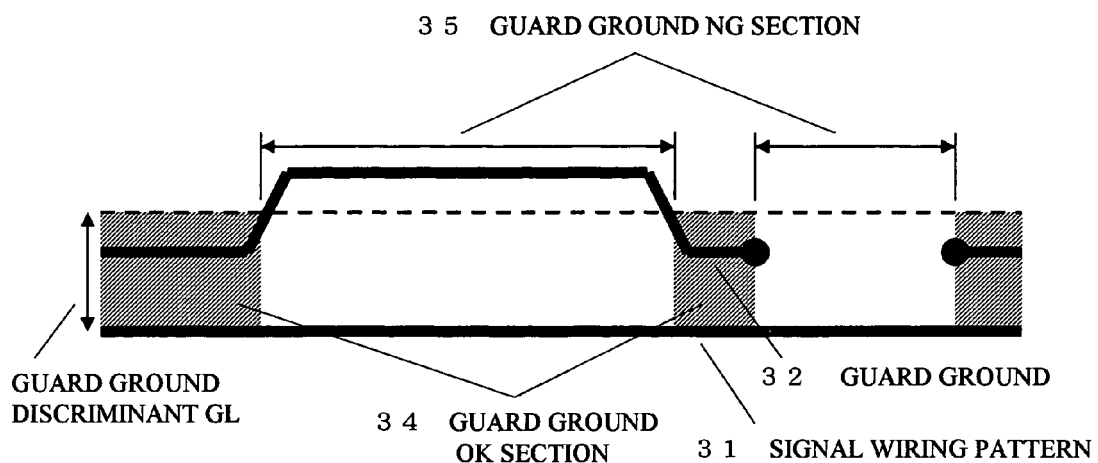
FIGS. 3A and 3B are partial plan views for illustrating detection of a guard ground.
Figure 3B:
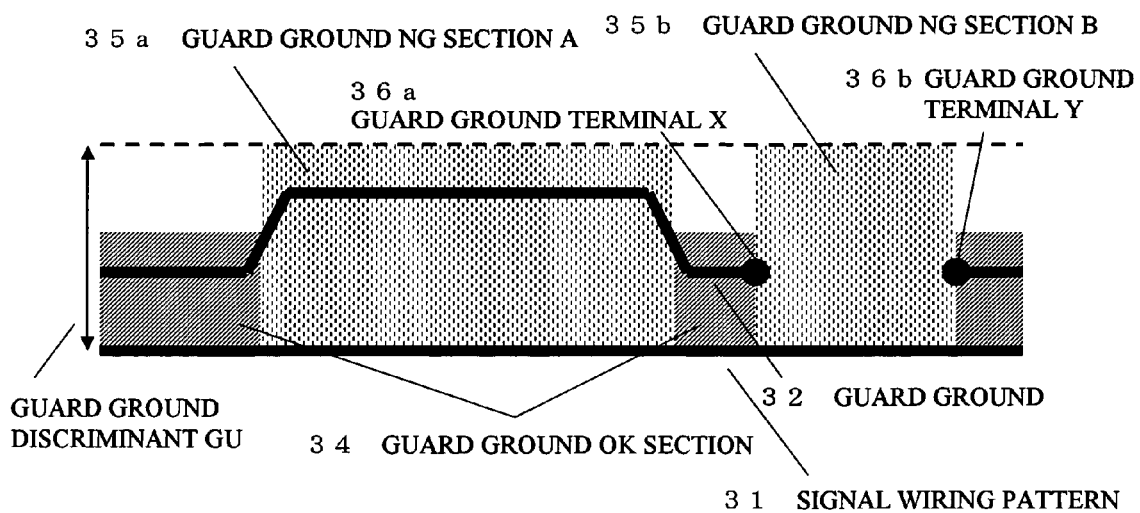

FIG. 1 is a block diagram showing an example of a CAD apparatus for EMC design according to the present invention. FIG. 2 is a flowchart showing an example of a method for checking a return path of a printed board, according to the present invention. FIGS. 3A and 3B are partial plan views for illustrating detection of a guard ground.

First, in FIG. 1, the CAD apparatus for EMC design includes an input and output device 11, such as keyboard, pointing device or display, a computer 12 for design of circuit, such as computing processor, a storage device 13, such as hard disk drive, optical disk drive or memory, and a printed board CAD program 14 for design of circuit patterns, containing a guard ground detecting means 21.

The guard ground detecting means 21 includes a signal wiring pattern detecting unit 22, a guard ground detecting unit 23, a plane ground detecting unit 24, and a return path judging unit 25.

The signal wiring pattern detecting unit 22 detects each of signal wiring patterns with reference to wiring information of the printed board to be designed. This wiring information is stored as design data of the printed board in the storage device 13.

The guard ground detecting unit 23 traces each of the signal wiring patterns, which are detected by the signal wiring pattern detecting unit 22, along the longitudinal direction thereof, to detect whether or not a guard ground, which functions as return path of the particular signal wiring pattern, exists on both sides of the signal wiring pattern. At this time, a first guard ground discriminant value GL for defining a search range is set up in advance, and existence of such a guard ground is detected within a distance from a center line of the signal wiring pattern to the first guard ground discriminant value GL.

And then, the guard ground detecting unit 23 identifies a section in which a guard ground exists within the distance to the first guard ground discriminant value GL, and another section in which no guard ground exists within the distance to the first guard ground discriminant value GL, to define the former as a guard ground OK section and the latter as a guard ground NG section, respectively. And then, in order to further expand the search range in the guard ground NG section, a second guard ground discriminant value GU, which is larger than the first guard ground discriminant value GL, is set up in advance. Existence of the guard ground is detected within another distance from a center line of the signal wiring pattern to the second guard ground discriminant value GU.

The return path judging unit 25 judges an error of guard ground when no guard ground exists within the distance to the second guard ground discriminant value GU in the guard ground NG section. Result of such error judgment may be represented to an operator through the input and output device 11, such as display, or be informed to another program.

Incidentally, in a case where the printed board to design is a multilayer printed board including (i) a wiring layer in which the signal wiring pattern resides, and (ii) a ground layer in which a ground plane resides, there is a possibility that the return path of the signal wiring pattern is formed in the ground plane of the ground layer through a via hole or the like. Therefore, when the guard ground is discontinued in the wiring layer, the plane ground detecting unit 24 detects whether or not a ground, which is connected to the guard ground, exists in the ground layer.

Next, the flowchart shown in FIG. 2 will be described. In a step a1, the signal wiring pattern detecting unit 22 detects each of signal wiring patterns with reference to wiring information of the printed board to be designed. For example, as shown in FIG. 3A, the signal wiring pattern 31 is detected.

Next, in a step a2, the first guard ground discriminant value GL is set. The first guard ground discriminant value GL defines, as shown in FIG. 3A, the search range on the both sides with reference to the center line of the signal wiring pattern 31. The first guard ground discriminant value GL is preferably set as the shortest distance between lines during pattern design of the printed board.

Next, in a step a3, the guard ground detecting unit 23 traces the signal wiring pattern along the longitudinal direction thereof. In a step a4, to detect whether or not a guard ground exists within the distance from the signal wiring pattern to the first guard ground discriminant value GL. When a guard ground exists within the distance to the first guard ground discriminant value GL throughout the traced section, the return path of the particular signal wiring pattern is meant to be secured. Transferring to a step as, the return path judging unit 25 judges no error of guard ground to complete the return path checking routine.

Meanwhile, in a case there is a section in which no guard ground exists within the distance to the first guard ground discriminant value GL, and then transferring to a step a10, the guard ground detecting unit 23 defines the section in which the guard ground exists within the distance to the first guard ground discriminant value GL as a guard ground OK section, and the section in which no guard ground exists within the distance to the first guard ground discriminant value GL as a guard ground NG section, respectively.

For example, as shown in FIG. 3A, the guard ground 32 is bent so as to get away from the signal wiring pattern 31, resulting in a portion exceeding the first guard ground discriminant value GL and another portion in which the guard ground 32 is discontinued. The section containing these portions corresponds to a guard ground NG section 35. Further, the section containing a portion which does not exceed the first guard ground discriminant value GL corresponds to a guard ground OK section.

Next, in steps a11 and a12, the second guard ground discriminant value GU is set up to be larger than the first guard ground discriminant value GL. The second guard ground discriminant value GU is preferably set, as shown in FIG. 3B, so as to expand more the search range in the guard ground NG section 35 and to contain the bent portion of the guard ground 32, thereby extracting only the discontinued portion of the guard ground 32. The second guard ground discriminant value GU may be optionally changed based on a length of the guard ground NG section. For example, in a case the first guard ground discriminant value GL is set up at 0.2 mm of the shortest distance between lines for pattern design, the second guard ground discriminant value GU may be set up at approximately 10 mm.

Next, in a step a13, the guard ground detecting unit 23 re-traces it in a range of the guard ground NG section to detect whether or not the guard ground exists within the distance to the second guard ground discriminant value GU. When there is a section in which no guard ground exists within the distance to the second guard ground discriminant value GU in the guard ground NG section, transferring to a step a15, the return path judging unit 25 judges an error of guard ground, and then displaying it for an operator by means of the input and output device 11 to complete the return path checking routine.

Meanwhile, in the step a13, when the guard ground exists within the distance to the second guard ground discriminant value GU in the guard ground NG section, transferring to a step a14, it is detected whether the guard ground is continuous or not in the guard ground NG section. When the guard ground is continuous, the return path of the particular signal wiring pattern is meant to be secured. Transferring to the step as, the return path judging unit 25 judges no error of guard ground to complete the return path checking routine.

Meanwhile, in the step a14, if the guard ground is not continuous in the guard ground NG section, the return path of the particular signal wiring pattern is meant to be lost. Transferring to the step a15, the return path judging unit 25 judges an error of guard ground, and then displaying it for an operator by means of the input and output device 11 to complete the return path checking routine.

For example, as shown in FIG. 3B, the guard ground 32 is continuous without discontinuity and does not exceed the second guard ground discriminant value GU in the guard ground NG section A 35a, resulting in judgment of no error of guard ground. On the other hand, the guard ground 32 does not exist in the guard ground NG section B 35b, resulting in judgment of an error of guard ground.

As described above, continuity of the guard ground is judged by employing the two larger and smaller guard ground discriminant values GL and GU, thereby reliably checking the return path of the signal wiring pattern.

Incidentally, the first embodiment exemplifies a case where the second guard ground discriminant value GU is set based on a length of the guard ground NG section. But the second guard ground discriminant value GU may be set based on a signal frequency or a signal current flowing in the signal wiring pattern, resulting in a similar effect.

Embodiment 2

Figure 4:
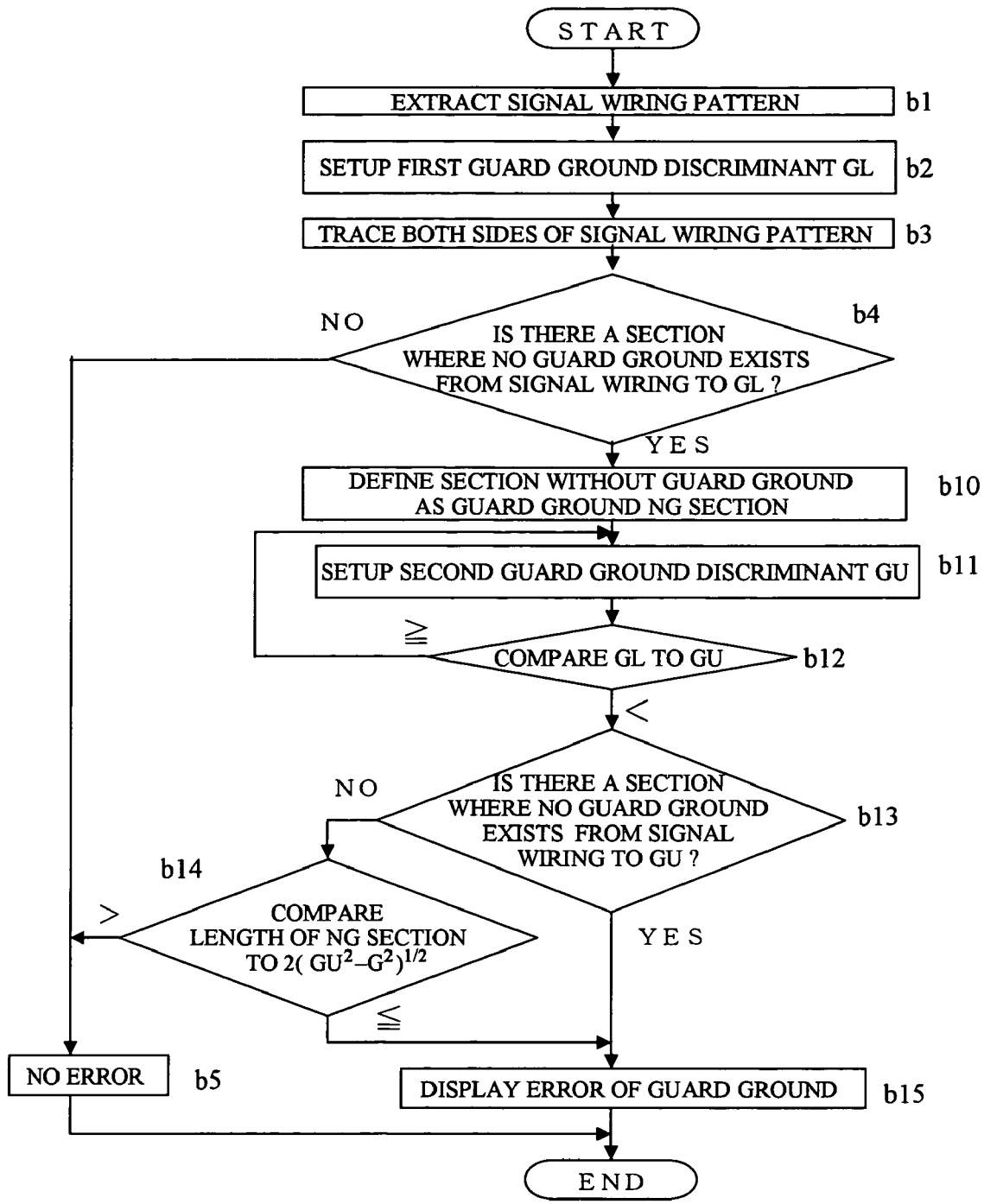
FIG. 4 is a flowchart showing another example of a method for checking a return path of a printed board, according to the present invention.
Figure 5:
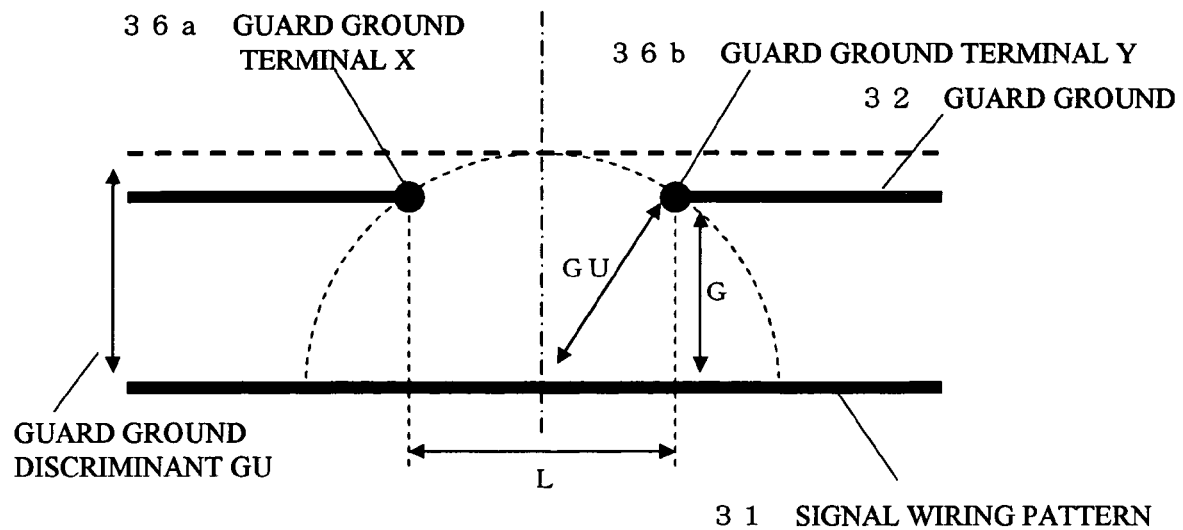
FIG. 5 is a partial plan view for illustrating detection of a guard ground.

FIG. 4 is a flowchart showing another example of a method for checking a return path of a printed board, according to the present invention. FIG. 5 is a partial plan view for illustrating detection of a guard ground. In this embodiment, the CAD apparatus for EMC design shown in FIG. 1 is also used.

In this embodiment, in a step b14 shown in FIG. 4, the continuity of the guard ground is judged by numerical comparison.

In a step b1 of FIG. 4, the signal wiring pattern detecting unit 22 detects each of signal wiring patterns with reference to wiring information of the printed board to be designed. For example, as shown in FIG. 5A, the signal wiring pattern 31 is detected.

Next, in a step b2, the first guard ground discriminant value GL is set. The first guard ground discriminant value GL defines, as shown in FIG. 3A, the search range on the both sides with reference to the center line of the signal wiring pattern 31. The first guard ground discriminant value GL is preferably set as a shortest distance between lines during pattern design of the printed board.

Next, in a step b3, the guard ground detecting unit 23 traces the signal wiring pattern along the longitudinal direction thereof. In a step b4, a detection is made as to whether or not a guard ground exists within the distance from the signal wiring pattern to the first guard ground discriminant value GL. When a guard ground exists within the distance to the first guard ground discriminant value GL throughout the traced section, the return path of the particular signal wiring pattern is meant to be secured. Transferring to a step b5, the return path judging unit 25 judges no error of guard ground to complete the return path checking routine.

Meanwhile, in a case there is a section in which no guard ground exists within the distance to the first guard ground discriminant value GL, and then transferring to a step b10, the guard ground detecting unit 23 defines the section in which the guard ground exists within the distance to the first guard ground discriminant value GL as a guard ground OK section, and the section in which no guard ground exists within the distance to the first guard ground discriminant value GL as a guard ground NG section, respectively.

For example, as shown in FIG. 3A, the guard ground 32 is bent so as to get away from the signal wiring pattern 31, resulting in a portion exceeding the first guard ground discriminant value GL and another portion in which the guard ground 32 is discontinued. The section containing these portions corresponds to a guard ground NG section 35. Further, the section containing a portion which does not exceed the first guard ground discriminant value GL corresponds to a guard ground OK section.

Next, in steps b11 and b12, the second guard ground discriminant value GU is set as larger than the first guard ground discriminant value GL. The second guard ground discriminant value GU is preferably set, as shown in FIG. 3B, so as to expand more the search range in the guard ground NG section 35 and to contain the bent portion of the guard ground 32, thereby extracting only the discontinued portion of the guard ground 32. The second guard ground discriminant value GU may be optionally changed based on a length of the guard ground NG section. For example, in a case the first guard ground discriminant value GL is set up at 0.2 mm of the shortest distance between lines for pattern design, the second guard ground discriminant value GU may be set at approximately 10 mm.

Next, in a step b13, the guard ground detecting unit 23 re-traces it in a range of the guard ground NG section to detect whether or not the guard ground exists within the distance to the second guard ground discriminant value GU.

When there is a section in which no guard ground exists within the distance to the second guard ground discriminant value GU in the guard ground NG section, transferring to a step b15, the return path judging unit 25 judges an error of guard ground, and then displays the error for an operator to see by means of the input and output device 11 to complete the return path checking routine.

Meanwhile, in the step b13, when the guard ground exists within the distance to the second guard ground discriminant value GU in the guard ground NG section, transferring to the step b14, as shown in FIG. 5, it is judged whether or not a relation: $L \leq 2(GU^2 - G^2)^{1/2}$ is satisfied, wherein L is a length of the guard ground NG section, and G is a distance from the signal wiring pattern on the border of the guard ground NG section to the guard ground. When the relation is satisfied, transferring to the step b15, the return path judging unit 25 judges an error of guard ground, and then displaying it for an operator by means of the input and output device 11 to complete the return path checking routine.

Meanwhile, in the step b14, when $L>2(GU^2-G^2)^{1/2}$ is satisfied, transferring to the step b5, the return path judging unit 25 judges no error of guard ground to complete the return path checking routine.

FIG. 5 illustrates a case where the guard ground 32 is discontinued at guard ground terminals X 36a and Y 36b. In a case a discontinuous length L thereof is equal to $2(GU^2-G^2)^{1/2}$, the terminals X and Y resides on a semicircle with a radius of GU and a center of intersection of the signal wiring pattern 31 and a center line 37 between the terminals X and Y. In another case $L>2(GU^2-G^2)^{1/2}$ is satisfied, the terminals X and Y exist outside of the semicircle with the radius of GU. Therefore, the guard ground is not continuous, resulting in an error of guard ground. In yet another case $L \leqq 2(GU^2-G^2)^{1/2}$ is satisfied, since the terminals X and Y exist inside of the semicircle with the radius of GU, it is impossible to detect the discontinuity of the guard ground. Accordingly, in comparison of the length L of the guard ground NG section with $2(GU^2-G^2)^{1/2}$ when the length L of the guard ground NG section is larger, a splay of the guard ground can be judged as no error. On the other hand, when the length L of the guard ground NG section is smaller, a short discontinuity can be judged as an error of guard ground.

As described above, both employment of the two larger and smaller guard ground discriminant values GL and GU, and numerical comparison of the length L of the guard ground NG section with the distance G from the signal wiring pattern on the border of the guard ground NG section to the guard ground facilitate reliable checking of the return path of the signal wiring pattern.

Embodiment 3

Figure 6:
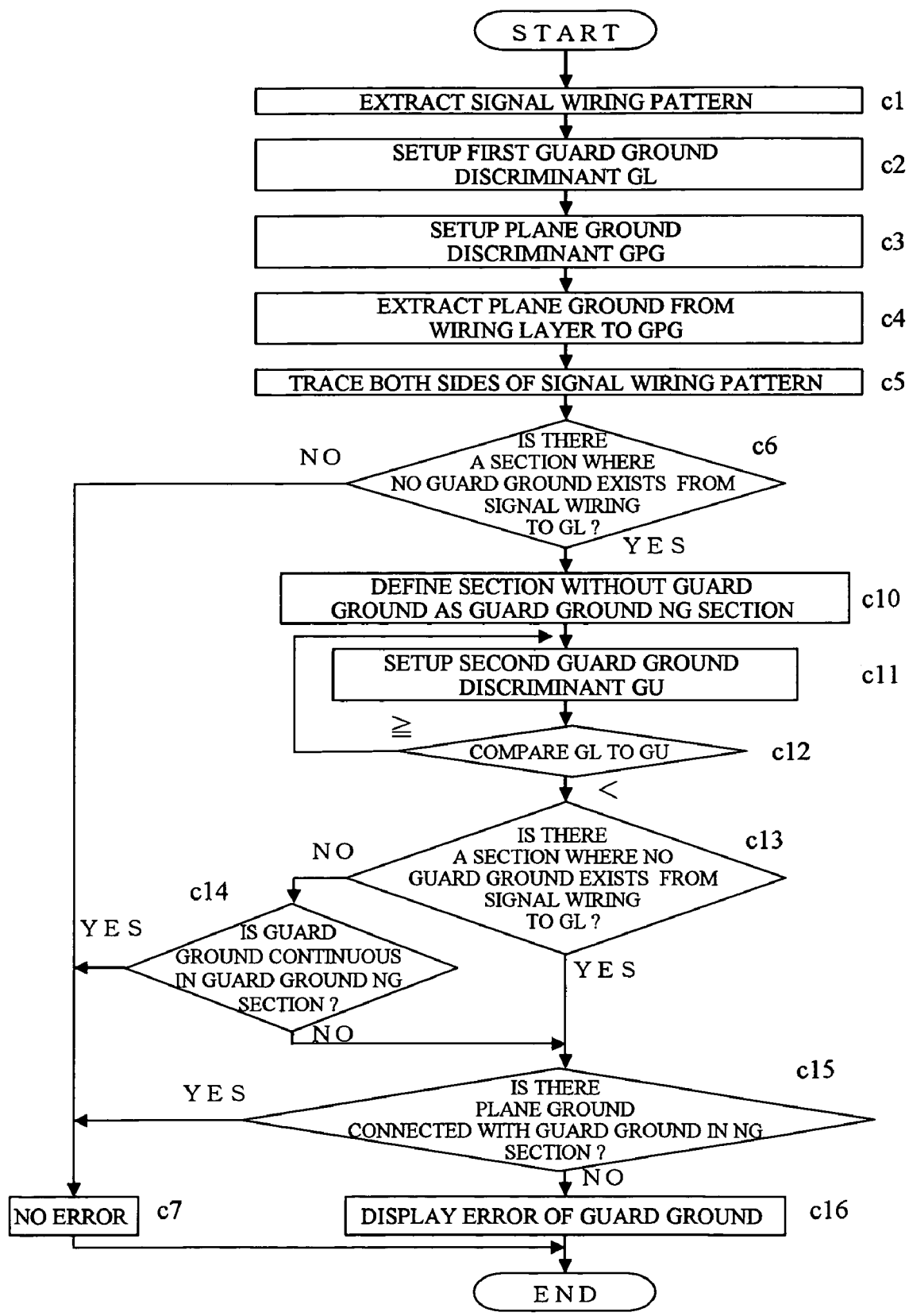
FIG. 6 is a flowchart showing a third example of a method for checking a return path of a printed board, according to the present invention.
Figure 7:
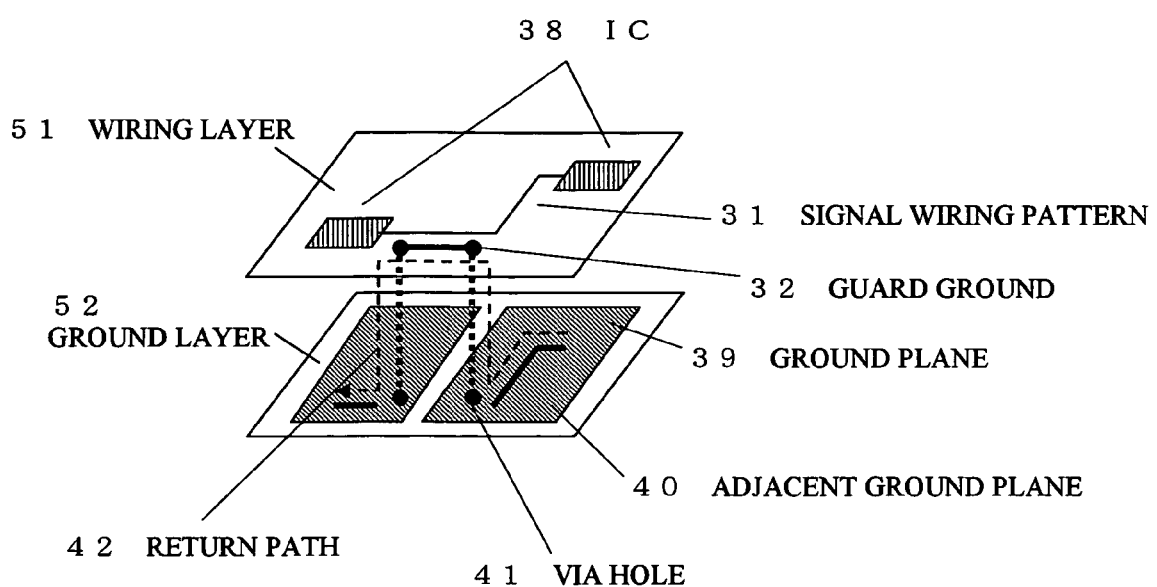
FIG. 7 is a schematic perspective view for illustrating detection of a guard ground.
Figure 8:
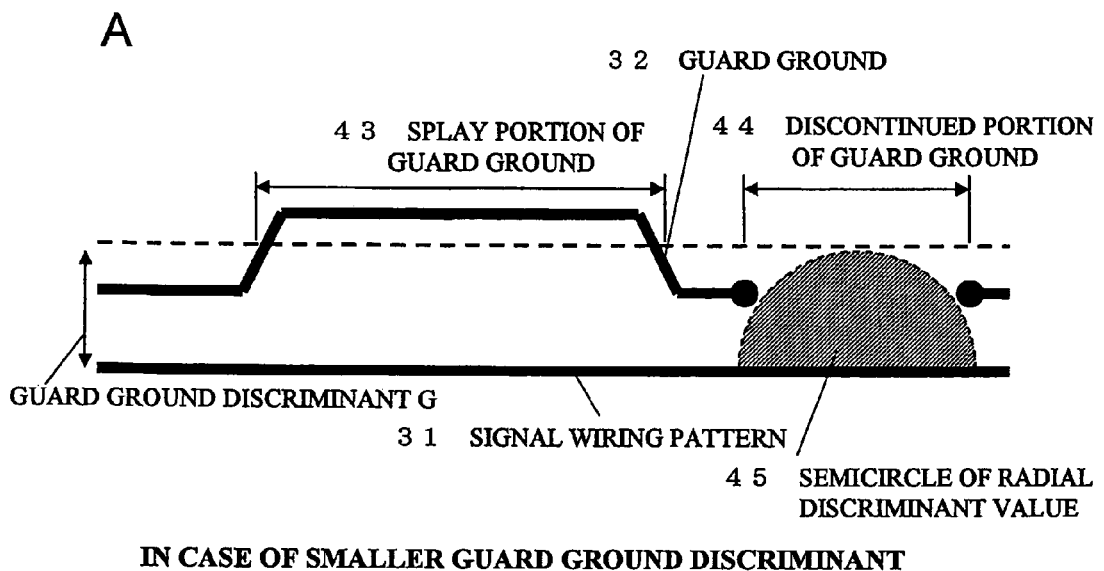
FIG. 8 is a partial plan view for illustrating a conventional method for detecting a guard ground in case of (i) a smaller guard ground discriminant (view A), and (ii) a larger guard ground discriminant (view B).
Figure 8:
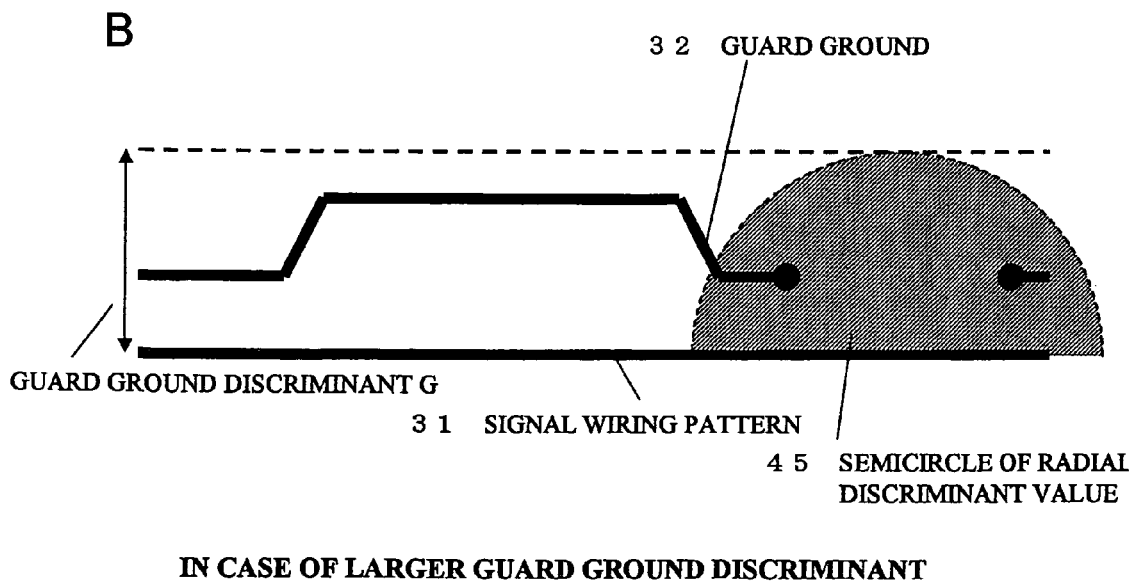

FIG. 6 is a flowchart showing a third example of a method for checking a return path of a printed board, according to the present invention. FIG. 7 is a schematic perspective view for illustrating detection of a guard ground. In this embodiment, the CAD apparatus for EMC design shown in FIG. 1 is also used.

In a case the printed board to designed is a multilayer printed board including a wiring layer in which the signal wiring pattern resides, and a ground layer in which a ground plane resides, there is a possibility that the return path of the signal wiring pattern is formed in the ground plane of the ground layer through a via hole or the like.

In this embodiment, when the guard ground residing in the wiring layer is not continuous, the plane ground detecting unit 24 detects whether or not the ground which is connected with the guard ground exists in the ground layer.

Firstly, in a step c1 of FIG. 6, the signal wiring pattern detecting unit 22 detects each of signal wiring patterns with reference to wiring information of the printed board to be designed. For example, as shown in FIG. 7, the signal wiring pattern 31, which is connected between two ICs 38, is detected.

Next, in a step c2, the first guard ground discriminant value GL is set. The first guard ground discriminant value GL defines, as shown in FIG. 3A, the search range on the both sides with reference to the center line of the signal wiring pattern 31. The first guard ground discriminant value GL is preferably set as the shortest distance between lines during pattern design of the printed board.

Next, in a step c3, a plane ground discriminant value GPG is set. The plane ground discriminant value GPG defines, as shown in FIG. 7, a search range in a lamination direction of the multilayer board with reference to the wiring layer 51 in which the signal wiring pattern 31 exists, for example, in terms of either an identification symbol of a layer to be searched or a distance from the wiring layer 51.

Next, in a step c4, the plane ground detecting unit 24 extracts a plane ground which exists in a range from the wiring layer, in which the particular signal wiring pattern resides, to the plane ground discriminant value GPG.

Next, in a step c5, the guard ground detecting unit 23 traces the signal wiring pattern along the longitudinal direction thereof, and then in a step c6, a detection is made as to whether or not a guard ground exists within the distance from the signal wiring pattern to the first guard ground discriminant value GL. When a guard ground exists within the distance to the first guard ground discriminant value GL throughout the traced section, the return path of the particular signal wiring pattern is meant to be secured. Transferring to a step c7, the return path judging unit 25 judges no error of guard ground to complete the return path checking routine.

Meanwhile, in a case there is a section in which no guard ground exists within the distance to the first guard ground discriminant value GL, and then transferring to a step c10, the guard ground detecting unit 23 defines the section in which the guard ground exists within the distance to the first guard ground discriminant value GL as a guard ground OK section, and the section in which no guard ground exists within the distance to the first guard ground discriminant value GL as a guard ground NG section, respectively.

As shown in FIG. 3A, the guard ground 32 is bent so as to get away from the signal wiring pattern 31, resulting in a portion exceeding the first guard ground discriminant value GL and another portion in which the guard ground 32 is discontinued. The section containing these portions corresponds to a guard ground NG section 35. Further, the section containing a portion which does not exceed the first guard ground discriminant value GL corresponds to a guard ground OK section.

Next, in steps c11 and c12, the second guard ground discriminant value GU is set to be larger than the first guard ground discriminant value GL. The second guard ground discriminant value GU is preferably set, as shown in FIG. 3B, so as to further expand the search range in the guard ground NG section 35 and to contain the bent portion of the guard ground 32, thereby extracting only the discontinued portion of the guard ground 32. The second guard ground discriminant value GU may be optionally changed based on a length of the guard ground NG section. For example, in a case the first guard ground discriminant value GL is set up at 0.2 mm of the shortest distance between lines for pattern design, the second guard ground discriminant value GU may be set up at approximately 10 mm.

Next, in a step c13, the guard ground detecting unit 23 re-traces it in a range of the guard ground NG section to detect whether or not the guard ground exists within the distance to the second guard ground discriminant value GU. When there is a section in which no guard ground exists within the distance to the second guard ground discriminant value GU in the guard ground NG section, the process is transferred to a step c15.

Meanwhile, in the step c13, when the guard ground exists within the distance to the second guard ground discriminant value GU in the guard ground NG section, transferring to a step c14, it is judged whether or not the guard ground is continuous in the guard ground NG section. When the guard ground is continuous, the return path of the particular signal wiring pattern is meant to be secured. Transferring to a step c7, the return path judging unit 25 judges no error of guard ground to complete the return path checking routine.

Meanwhile, in the step c14, when the guard ground is not continuous in the guard ground NG section, the return path of the particular signal wiring pattern is meant to be lost. The process is transferred to the step c15.

In the step c15, the plane ground detecting unit 24 searches for a plane ground extracted in the step c4 to detect whether or not the plane ground which is connected with the guard ground exists in the ground layer. When the above plane ground exists, the return path of the particular signal wiring pattern is meant to be secured. Transferring to the step c7, the return path judging unit 25 judges no error of guard ground to complete the return path checking routine.

For example, as shown in FIG. 7, the guard ground 32 is not discontinuous in the wiring layer 51, but is connected through a via hole 41 to an adjacent plane ground 40 in the ground layer 52, which resides within the plane ground discriminant value GPG. Therefore, the return path is secured, resulting in judgment of no error of guard ground.

Meanwhile, in the step c15, when no plane ground which is connected with the guard ground exists, transferring to a step c16, the return path judging unit 25 judges an error of guard ground, and then displays the error for an operator to see by means of the input and output device 11 to complete the return path checking routine.

As described above, both employment of the two larger and smaller guard ground discriminant values GL and GU, and judgment of continuity of the guard ground by taking account of the plane ground residing in another layer facilitate reliable-checking of the return path of the signal wiring pattern.

By employing the method for checking a return path of a printed board and the CAD apparatus for designing patterns of a printed board according to the present invention, it is possible to quickly check both a splay portion and a short discontinued portion of the guard ground without mistake. Consequently, an EMC countermeasure for suppressing an electromagnetic wave generated from a high frequency current loop, which is configured of the signal wiring and the guard ground, can be effectively adopted.

The invention claimed is:

1. A method for checking a return path of a printed board, the method comprising:
   detecting a signal wiring pattern with reference to wiring information of the printed board;
   tracing along a longitudinal direction of the signal wiring pattern while detecting whether or not a guard ground exists within a distance from the signal wiring pattern to a predetermined first discriminant value GL;
   identifying a non-guard ground section in which no guard ground exists within the distance from the signal wiring pattern to the first discriminant value GL;
   setting a second discriminant value GU which is larger than the first discriminant value GL;
   detecting whether or not a guard ground exists within a distance from the signal wiring pattern to the second discriminant value GU in the identified non-guard ground section; and
   judging an error of guard ground when it is detected that no guard ground exists within the distance from the signal wiring pattern to the second discriminant value GU in the identified non-guard ground section.

2. The method according to claim 1, further comprising judging an error of guard ground when a discontinued guard ground exists within the distance from the signal wiring pattern to the second discriminant value GU in the identified non-guard ground section.

3. The method according to claim 1 further comprising judging an error of guard ground when $L \leq 2(GU^2 - G^2)^{1/2}$, wherein L is a length of the identified non-guard ground section, and G is a distance from the signal wiring pattern at a border of the identified non-guard ground section to the guard ground.

4. The method according to claim 1, wherein:
   the printed board is a multilayer printed board including a wiring layer in which the signal wiring pattern resides, and a ground layer in which a ground plane resides; and
   the method further comprises judging an error of guard ground when (i) no guard ground exists within the distance from the signal wiring pattern to the second discriminant value GU in the identified non-guard ground sections and (ii) no ground, which is connected to the guard ground, exists in the ground layer.

5. The method according to claim 1, wherein the first discriminant value GL is defined as a shortest distance between lines during pattern design of the printed board.

6. A recording medium, having stored thereon, a program for causing a computer to execute the method according to claim 1.

7. A CAD apparatus for designing patterns of a printed board, the CAD apparatus comprising:
   a signal wiring pattern detecting unit for detecting a signal wiring pattern with reference to wiring information of the printed board;
   a guard ground detecting unit for (i) tracing along a longitudinal direction of the signal wiring pattern while detecting whether or not a guard ground exists within a distance from the signal wiring pattern to a predetermined first discriminant value GL, (ii) identifying a non-guard ground section in which no guard ground exists within the distance from the signal wiring pattern to the first discriminant value GL, and (iii) detecting, in the identified non-guard ground section, whether or not a guard ground exists within a distance from the signal wiring pattern to a second discriminant value GU, which is larger than the first discriminant value GL; and
   a return path judging unit for judging an error of guard ground when the guard ground detecting unit detects that no guard ground exists within the distance from the signal wiring pattern to the second discriminant value GU.

* * * * *